US010838347B2

(12) United States Patent
Seto

(10) Patent No.: US 10,838,347 B2
(45) Date of Patent: Nov. 17, 2020

(54) TORSION COIL SPRING SUPPORTING STRUCTURE, ELECTRICAL CONNECTING MEMBER AND IMAGE FORMING APPARATUS

(71) Applicant: CANON KABUSHIKI KAISHA, Tokyo (JP)

(72) Inventor: Masaki Seto, Gotemba (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/655,778

(22) Filed: Oct. 17, 2019

(65) Prior Publication Data

US 2020/0125025 A1  Apr. 23, 2020

(30) Foreign Application Priority Data

Oct. 19, 2018 (JP) ................. 2018-197463

(51) Int. Cl.
| G03G 15/00 | (2006.01) |
| G03G 21/00 | (2006.01) |
| B25B 27/30 | (2006.01) |
| G03G 21/16 | (2006.01) |
| H01R 13/24 | (2006.01) |
| F16F 1/48 | (2006.01) |
| H05K 1/18 | (2006.01) |

(52) U.S. Cl.
CPC .............. *G03G 15/80* (2013.01); *F16F 1/48* (2013.01); *G03G 15/6555* (2013.01); *G03G 21/1652* (2013.01); *H01R 13/2421* (2013.01); *H05K 1/18* (2013.01)

(58) Field of Classification Search
CPC .............. G03G 15/80; G03G 15/6555; G03G 21/1652; G03G 2221/166; F16F 1/48; H01R 13/2421; H05K 1/18; B25B 27/30
See application file for complete search history.

(56) References Cited

U.S. PATENT DOCUMENTS

| 6,923,690 B1 * | 8/2005 | Wang ................. H01R 13/2421 439/500 |
| 10,601,151 B2 * | 3/2020 | Nakamura ........... H01R 4/4863 |
| 2005/0064738 A1 * | 3/2005 | Zheng ................ H01R 13/2421 439/65 |

(Continued)

FOREIGN PATENT DOCUMENTS

JP       2015142105 A     8/2015

*Primary Examiner* — Sophia S Chen
(74) *Attorney, Agent, or Firm* — Venable LLP

(57) ABSTRACT

A torsion coil spring supporting structure includes a first supporting portion opposing one end of a torsion coil spring with respect to an axial direction of the torsion coil spring; and a second supporting portion opposing the other end of the torsion coil spring with respect to the axial direction. The first supporting portion includes a spring supporting portion cooperative with the second supporting portion to support the torsion coil spring at a mounting position. The first supporting portion is elastically deformable, by moving the torsion coil spring, to permit the torsion coil to move to the mounting position in a direction crossing the axial direction and elastically restorable to place the spring supporting portion in an inner diameter portion of the torsion coil spring, thus supporting the torsion coil spring at the mounting position.

15 Claims, 14 Drawing Sheets

(56) References Cited

U.S. PATENT DOCUMENTS

| | | | |
|---|---|---|---|
| 2015/0037060 A1* | 2/2015 | Hamaya | G03G 15/80 399/90 |
| 2015/0216036 A1 | 7/2015 | Serizawa | |
| 2018/0129161 A1* | 5/2018 | Kim | G03G 21/1846 |
| 2019/0006779 A1* | 1/2019 | Kawamura | H01R 13/2421 |

* cited by examiner

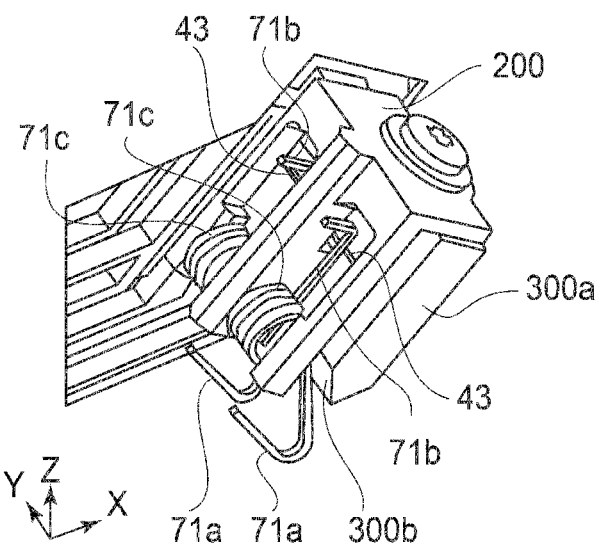
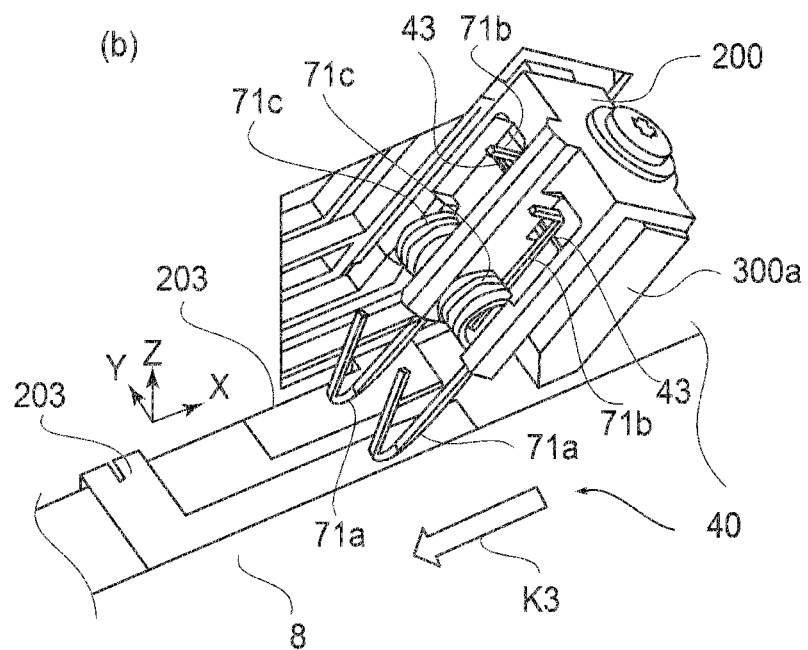
FIG.13

TORSION COIL SPRING SUPPORTING STRUCTURE, ELECTRICAL CONNECTING MEMBER AND IMAGE FORMING APPARATUS

FIELD OF THE INVENTION AND RELATED ART

The present invention relates to a torsion coil spring supporting structure in an apparatus such as an image forming apparatus, and relates to an electrical connecting member and the image forming apparatus.

In the image forming apparatus of an electrophotographic type, an electrostatic latent image is formed on a photosensitive member electrically charged in a charging portion and is developed into a toner image in a developing portion, and then the toner image is transferred onto a sheet in a transfer portion, so that an image is formed. Here, to the charging portion, the developing portion and the transfer portion, high voltages from several hundred volts several kilovolts are applied. For this reason, the image forming apparatus is provided with a voltage source substrate including a high voltage source circuit, for generating a high voltage, on a printed board.

Further, as an energization path for applying the high voltages, generated by this voltage source substrate, to the respective portions, in the case where the voltage source substrate and the respective portions are connected by high-voltage cables, worsening of an assembling property and an increase in cost are invited. Therefore, a constitution in which the voltage source substrate and the respective portions are electrically connected without using the high-voltage cables has been widely used.

For example, a constitution in which the voltage source substrate and the charging portion are electrically connected by a torsion coil spring has been disclosed (Japanese Laid-Open Patent Application 2015-142105). In this constitution, a structure in which one end of the torsion coil spring is contacted to a jumper wire (line) which is an electrical contact portion provided in a through hole of the voltage source substrate is disclosed. Compared with a constitution in which the voltage source substrate and the charging portion are electrically connected by pressing a coil portion of a compression coil spring against an electrical contact portion of the voltage source substrate, this constitution is capable to decreasing an area of the electrical contact portion and thus is capable of realizing space saving.

However, in this constitution, when the torsion coil spring is mounted, there is a need that the coil portion of the torsion coil spring is mounted to a shaft portion or the like, and in addition, an arm portion on which a spring force acts in hooked. For this reason, in a constitution in which a plurality of electrical contact portions are provided on the voltage source substrate and electrical connection is carried out by a plurality of torsion coil springs, an assembling operation becomes very complicated and needs much time.

Further, in recent years, in the case automation of a component part assembling operation by an operation robot is intended to be realized, such a complicated operation requires, as the operation robot an expensive robot high in degree of freedom.

The present invention has been accomplished in view of the above-described circumstances, and a principal object of the present invention is to provide a torsion coil spring supporting structure capable of improving an assembling operativity.

SUMMARY OF THE INVENTION

According to an aspect of the present invention, there is provided a torsion coil supporting structure comprising: a first supporting portion provided at a position opposing one end of a torsion coil spring with respect to an axial direction of the torsion coil spring and configured to support the torsion coil spring; and a second supporting portion provided at a position opposing the other end of the torsion coil spring with respect to the axial direction and configured to support the torsion coil spring, wherein said first supporting portion includes a spring supporting portion cooperative with said second supporting portion to support the torsion coil spring at a mounting position, and wherein said first supporting portion is elastically deformable, by moving the torsion coil spring, to permit the torsion coil to move to the mounting position in a direction crossing the axial direction and elastically restorable to place said spring supporting portion in an inner diameter portion of the torsion coil spring, thus supporting the torsion coil spring at the mounting position.

According to another aspect of the present invention, there is provided an electrical connecting member comprising: a torsion coil spring which functions as a contact as a part of an electroconductive path and which has an electro-conductivity; a first supporting portion provided at a position opposing one end of the torsion coil spring with respect to an axial direction of the torsion coil spring and supporting the torsion coil spring; and a second supporting portion provided at a position opposing the other end of the torsion coil spring with respect to the axial direction and supporting the torsion coil spring, wherein the first supporting portion includes a spring supporting portion supporting the torsion coil spring by being inserted into the torsion coil spring, and wherein the first supporting portion is elastically deformable so that the spring supporting portion is moved away from the torsion coil spring in the axial direction.

Further features of the present invention will become apparent from the following description of exemplary embodiments with reference to the attached drawings.

Figure 7:
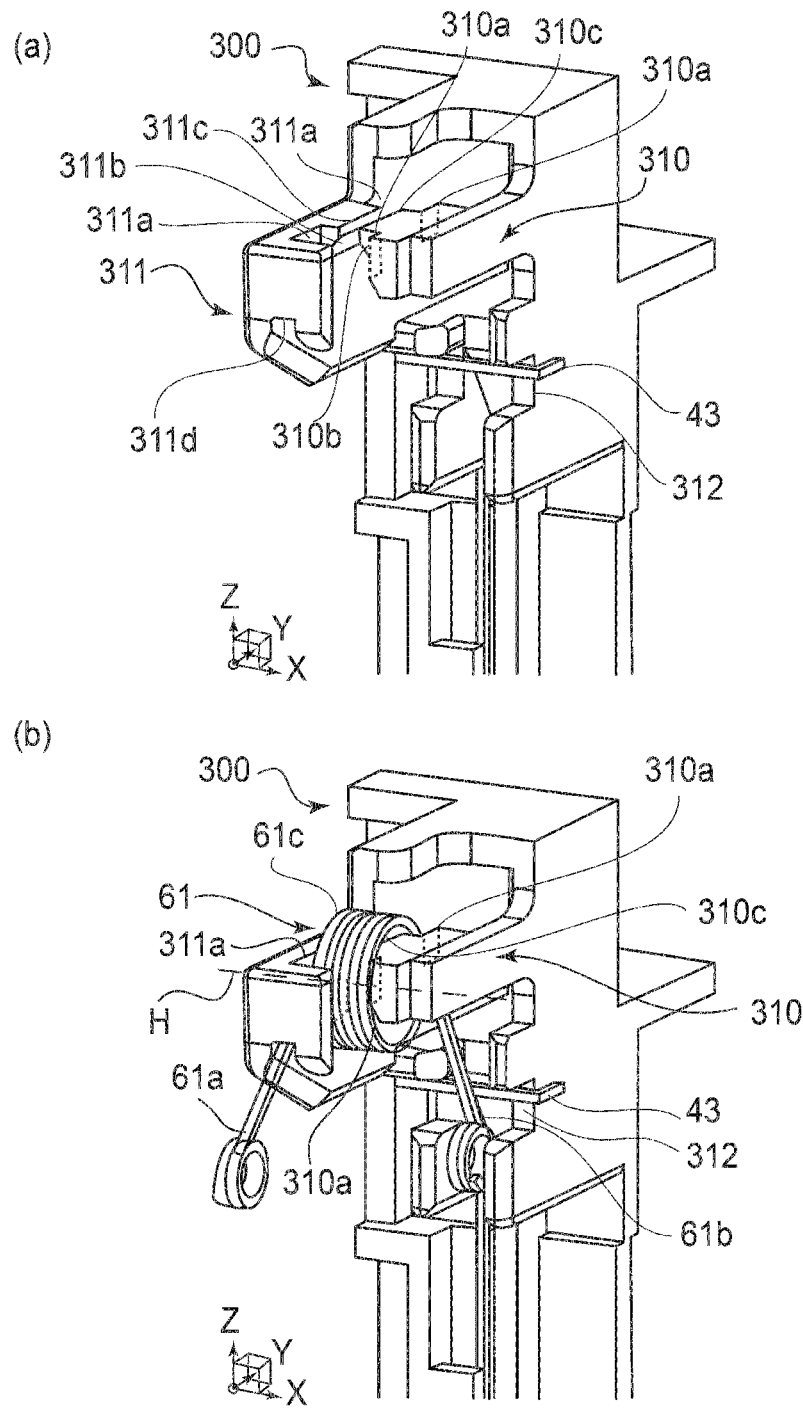

Parts (a) and (b) of FIG. 7 are perspective views of a spring supporting portion in the embodiment.

Figure 8:
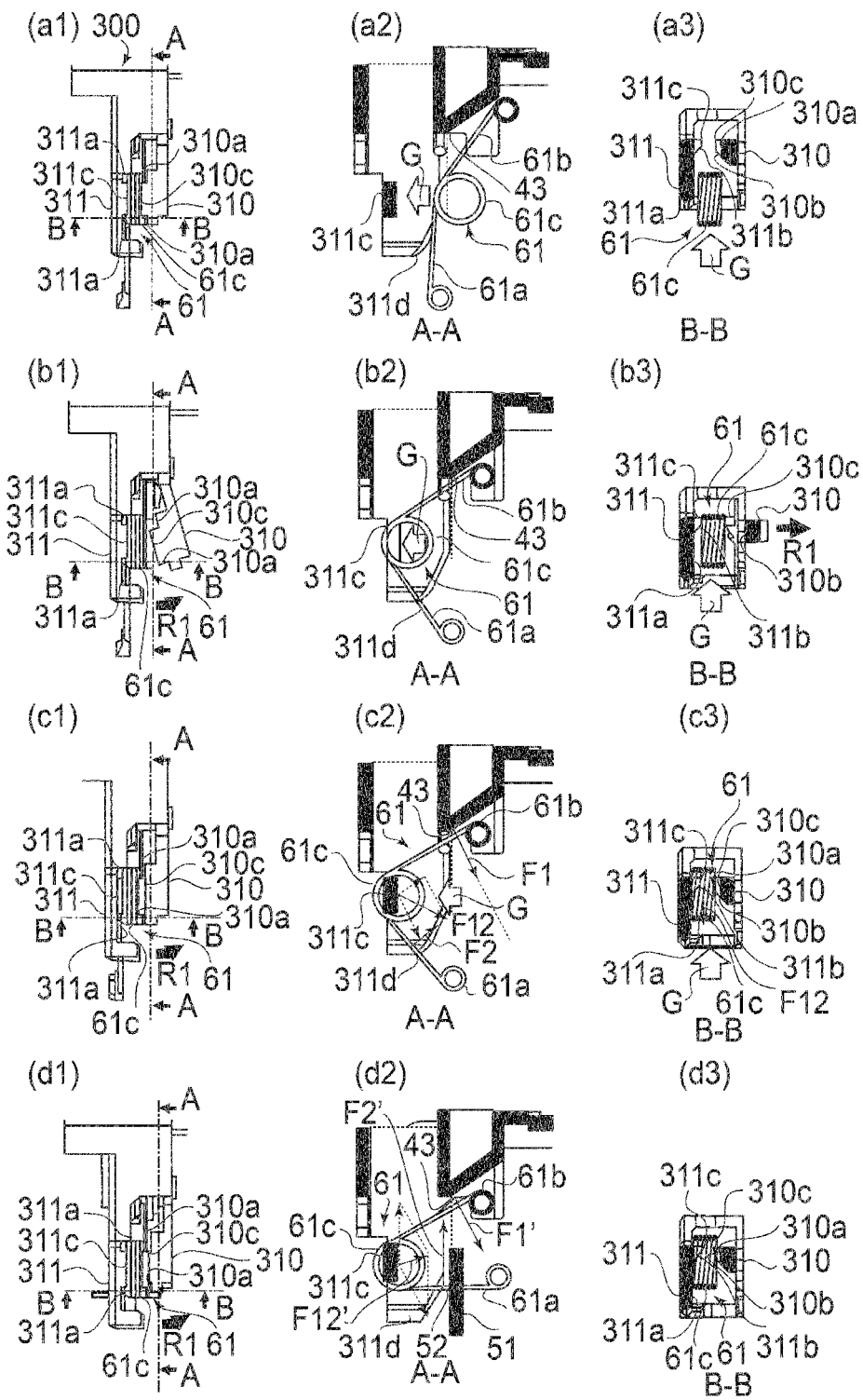

Parts (a1) to (d3) of FIG. 8 are schematic views for illustrating mounting of a contact spring in a holder in the embodiment.

Figure 9:
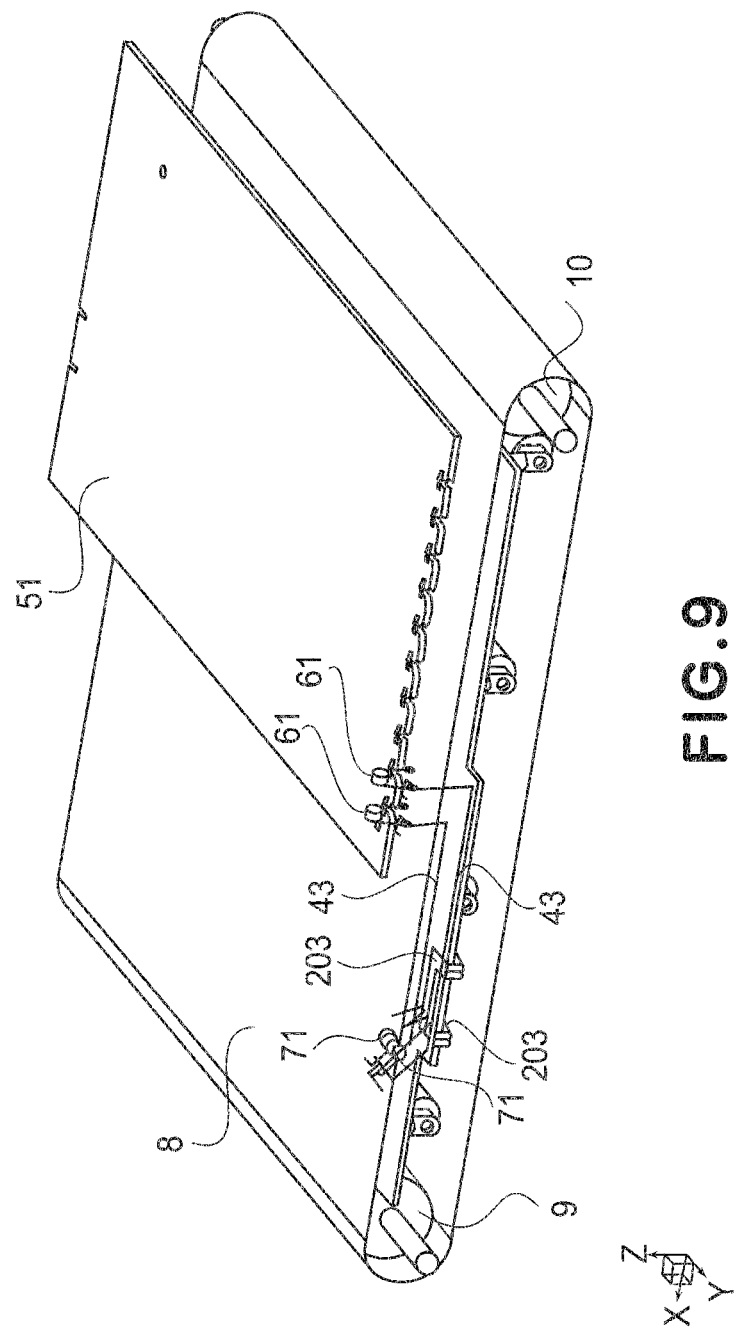

FIG. 9 is a perspective view of the voltage source substrate and an intermediary transfer unit in the embodiment.

Figure 10:
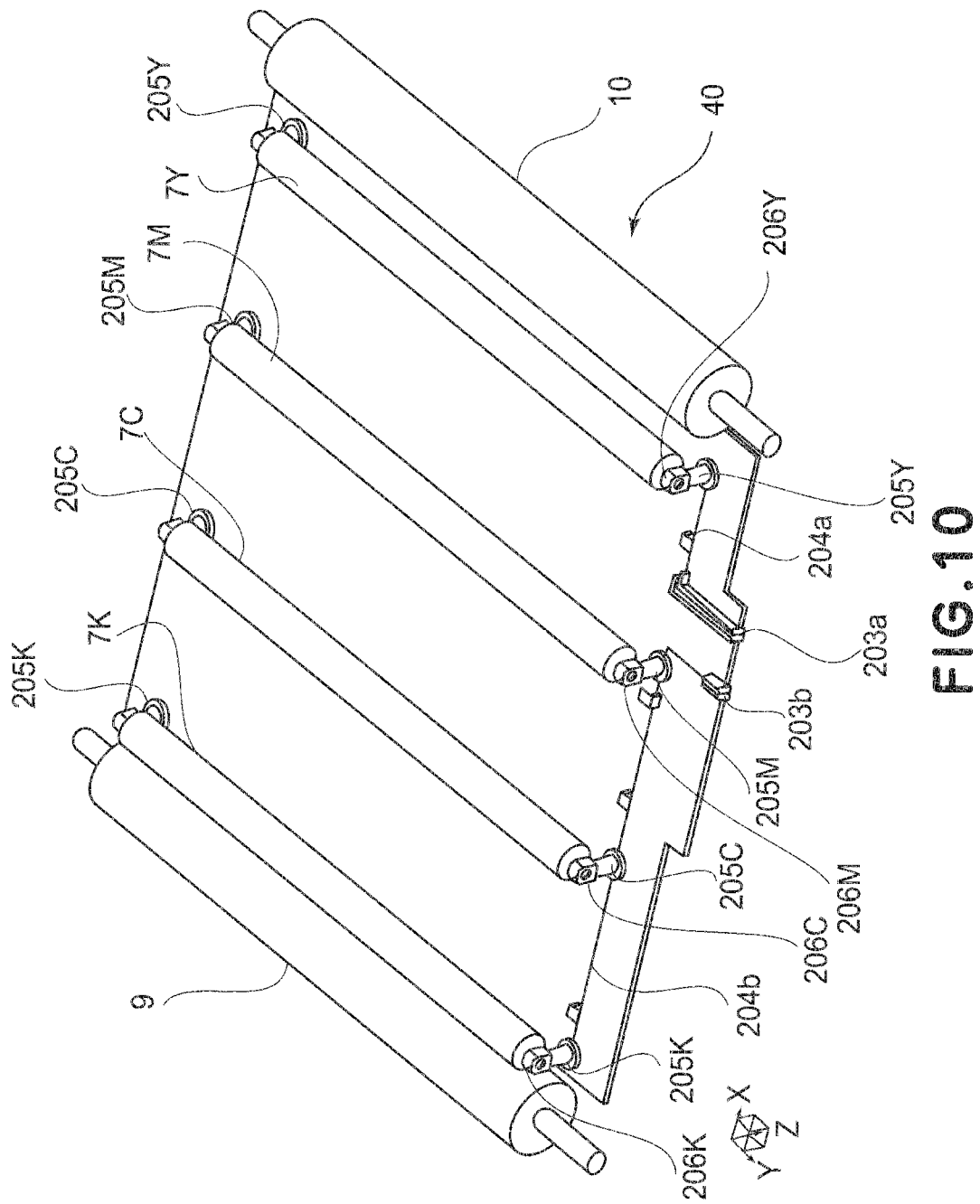

FIG. 10 is a perspective view of the intermediary transfer unit in the embodiment.

Figure 11:
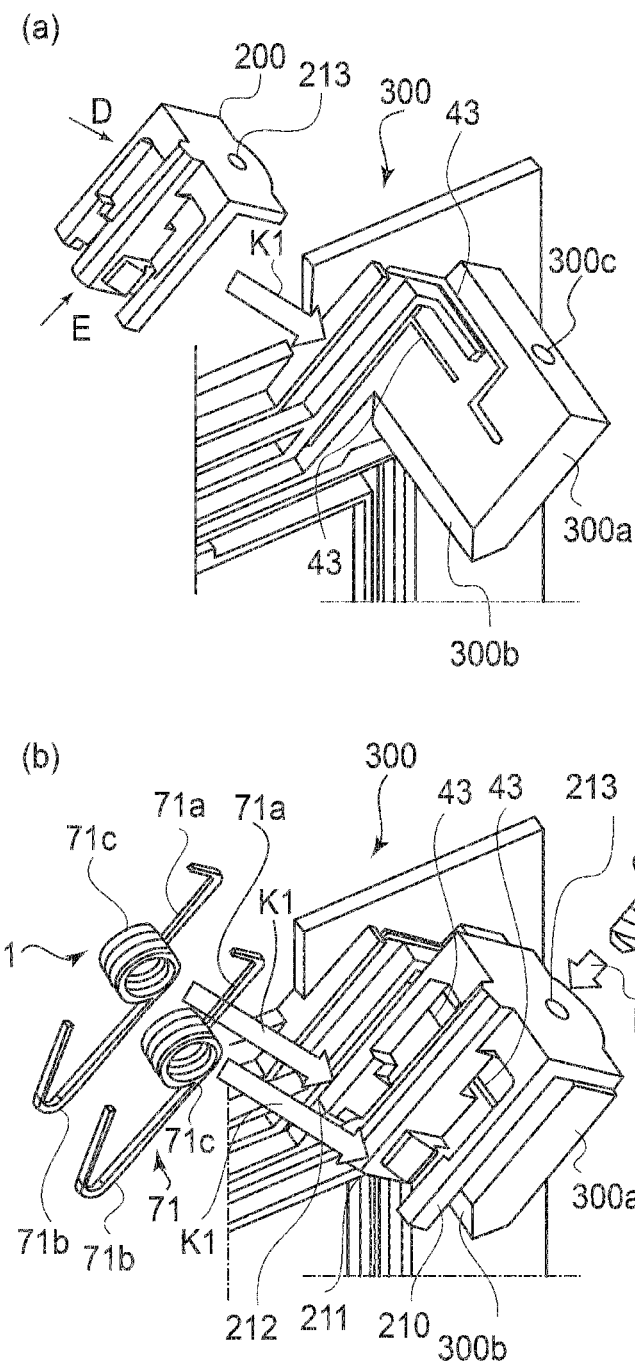

Parts (a) and (b) of FIG. 11 are perspective views of a contact spring and a contact spring supporting member in the embodiment.

Figure 12:
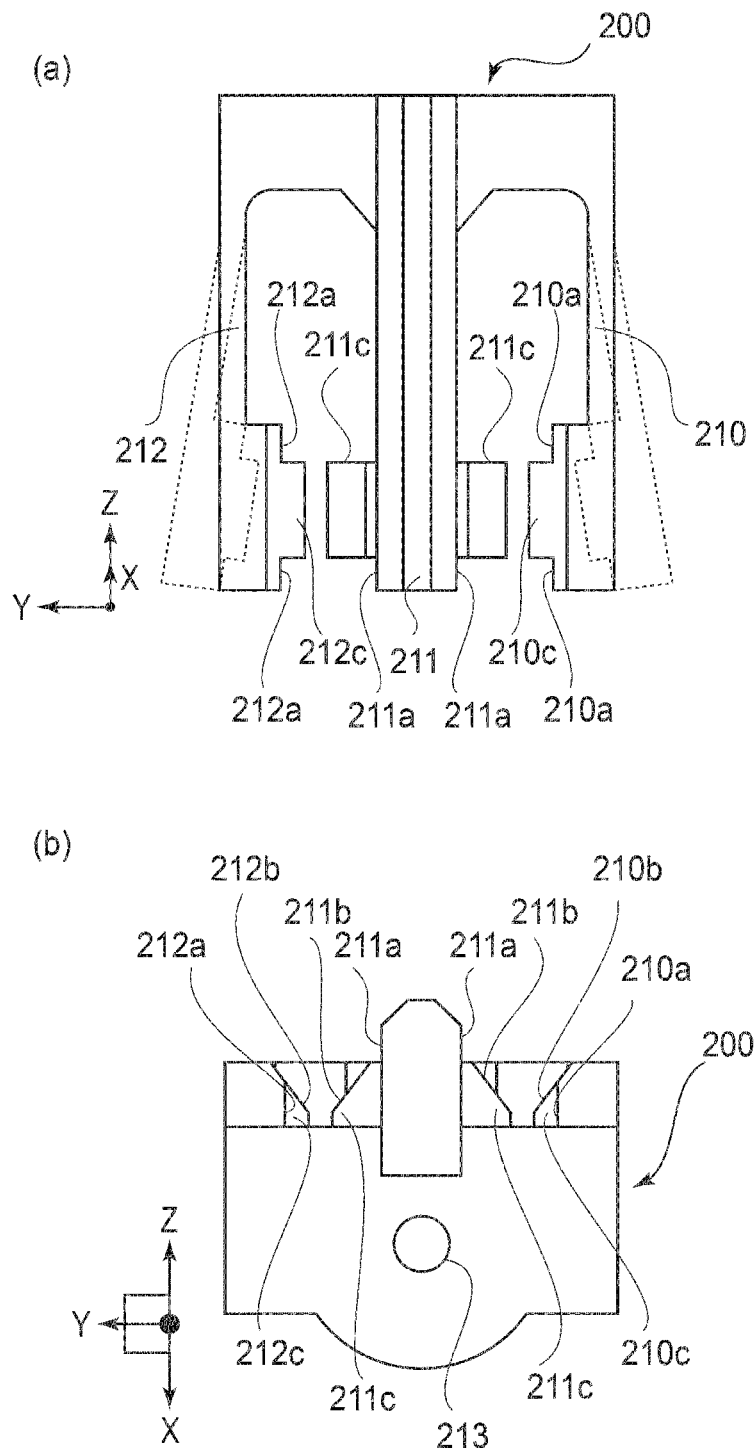

Parts (a) and (b) of FIG. 12 are schematic views taken along arrows of parts (a) and (b) of FIG. 11, respectively, in the embodiment.

Parts (a) and (b) of FIG. 13 are perspective views of the contact spring in a state of being mounted in the holder in the embodiment.

Figure 14:
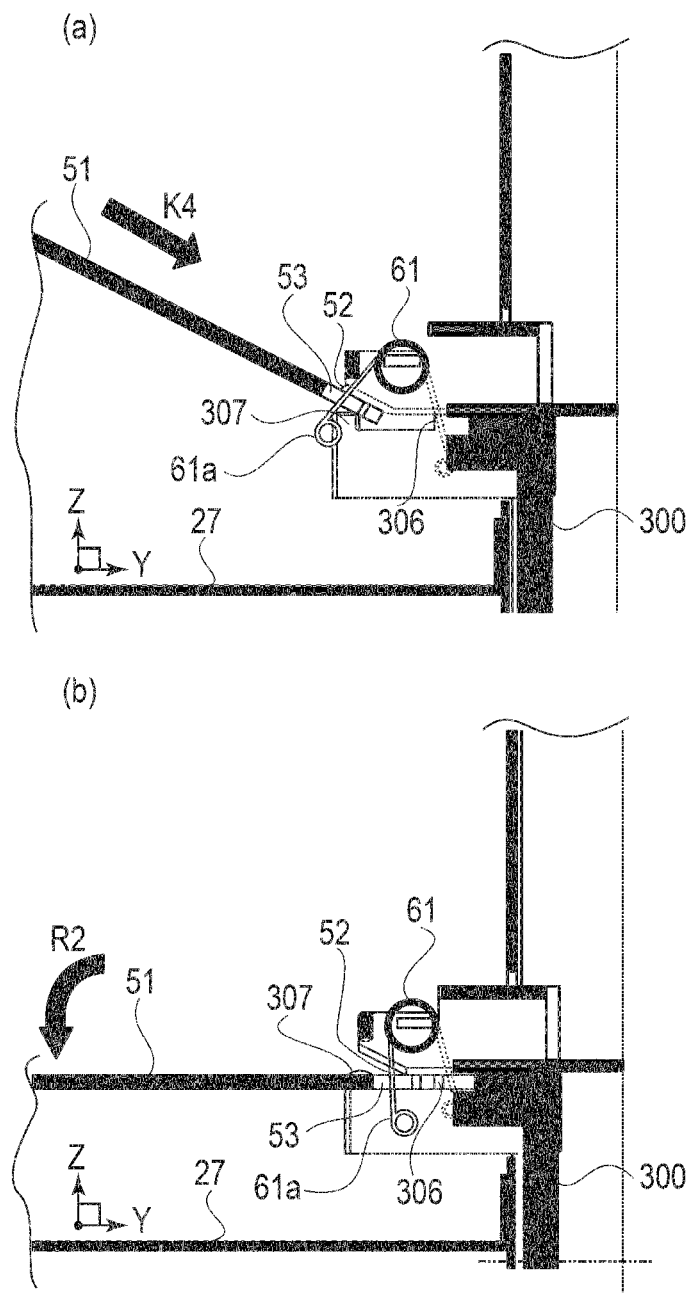

Parts (a) and (b) of FIG. 14 are schematic views for illustrating a voltage source substrate mounting operation in the embodiment.

BRIEF DESCRIPTION OF EMBODIMENTS

In the following, embodiments of the present invention will be specifically described with reference to the drawings. Incidentally, constituent elements described in the following embodiments are examples, and the present invention is not limited thereto.

Figure 1:
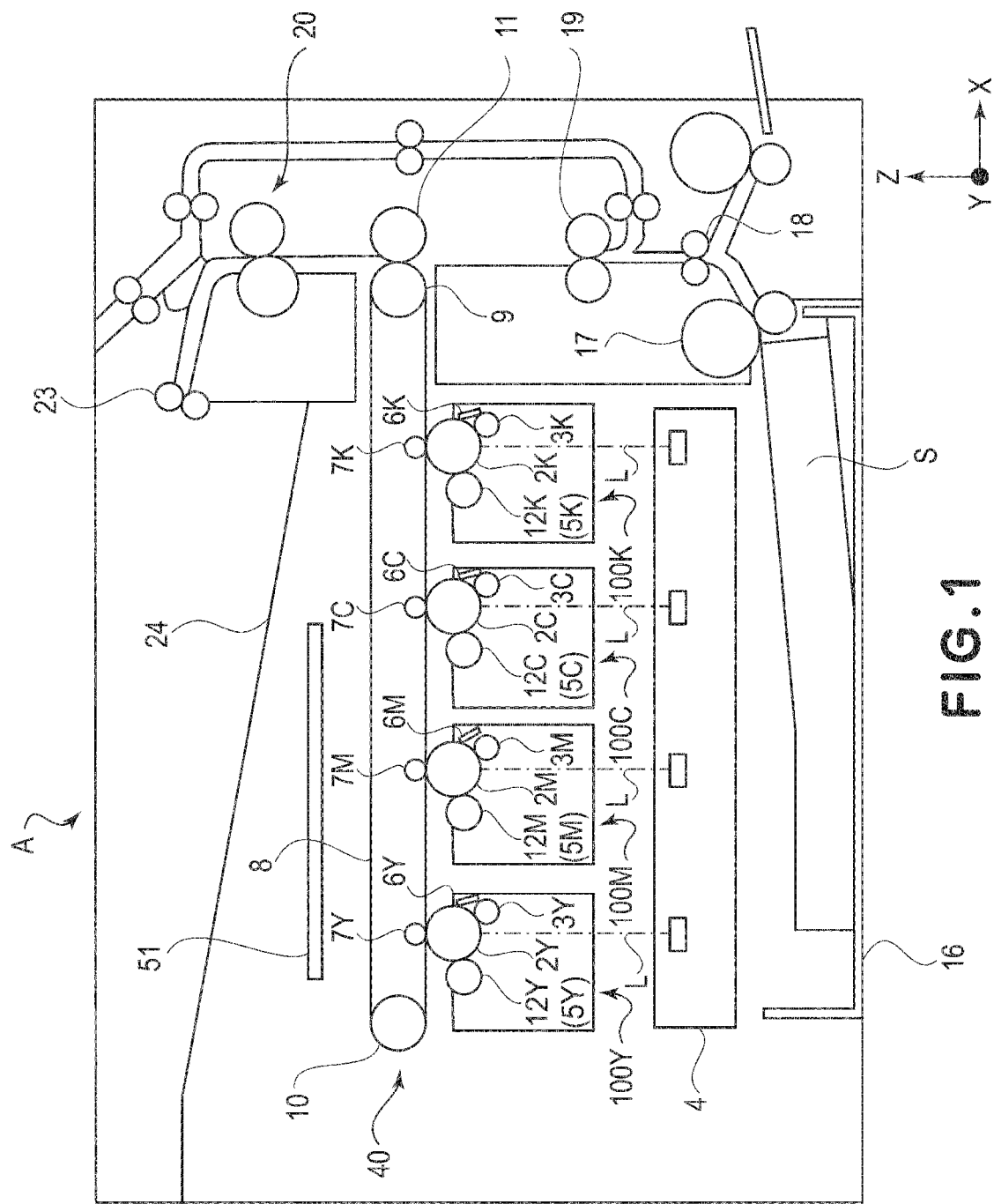
FIG. 1 is a schematic front sectional view of an image forming apparatus according to an embodiment.

FIG. 1 is a schematic front sectional view of an image forming apparatus according to an embodiment. Incidentally, description of a constitution according to this embodiment is made using the image forming apparatus as an example, and a general structure of the image forming apparatus will be described together with an operation of the image forming apparatus with reference to the drawings.

The image forming apparatus according to this embodiment is of an electrophotographic type in which toner images of four colors of yellow (Y), magenta (M), cyan (C) and black (K) are transferred onto an intermediary transfer belt and thereafter are transferred onto a sheet such as paper, so that an image is formed. Incidentally, in the following description, although Y, M, C and K are added as suffixes to members using toners of the respective colors, structures and operations of the respective members are substantially the same except that the colors of the toners are different from each other, and therefore, the suffixes will be appropriately be omitted except for the case where distinction of the members is required.

In FIG. 1, an image forming apparatus A includes an image forming portion where the image is formed by transferring the toner images on the sheet such as the paper, a sheet feeding portion for feeding the sheet toward the image forming portion, and a fixing portion for fixing the toner images on the sheet.

The image forming portion includes photosensitive drum 2 (2Y, 2M, 2C and 2K) as photosensitive members, charging rollers 3 (3Y, 3M, 3C, 3K) as charging portions for electrically charging surfaces of the photosensitive drums 2, and developing devices 5 (5Y, 5M, 5C, 5K) as developing portions. Further, the image forming portion includes primary transfer rollers 7 (7Y, 7M, 7C, 7K) as transfer portions, a laser scanner unit 4 as an exposure portion, cleaning blades 6 (6Y, 6M, 6C, 6K) and an intermediary transfer unit 40. Incidentally, the photosensitive drum 2, the charging roller and the developing device 5 are assembled into a unit as a cartridge 100 (100Y, 100M, 100C, 100K) mountable and dismountable from an apparatus main assembly of the image forming apparatus A.

The intermediary transfer unit 40 includes an intermediary transfer belt 8, a secondary transfer roller 11, a secondary transfer opposite roller 9 and a tension roller 10. The intermediary transfer belt 8 is an endless belt stretched by the secondary transfer opposite roller 9 and the tension roller 10, and the secondary transfer opposite roller 9 is rotated by a driving force of a driving source, so that the intermediary transfer belt is circulated by rotation of the secondary transfer opposite roller 9.

Next, an image forming operation will be described. Further, when a controller receives an image forming job signal, a sheet S stacked and accommodated in a sheet stacking portion 16 is sent to a secondary transfer portion comprising the secondary transfer roller 11 and the secondary transfer opposite to roller 9 by a feeding roller 17, a conveying roller pair 18 and a registration roller pair 19.

On the other hand, first, the surface of the photosensitive drum 2 as the photosensitive member is electrically charged uniformly by applying a charging bias to the charging roller 3 as the charging portion. Thereafter, on the basis of image data sent from an unshown external device or the like, the surface of the photosensitive drum 2 for each of the respective colors is irradiated with and exposed to laser light L emitted from the laser scanner unit 4 as the exposure portion. Thus, the photosensitive drum 2 as the photosensitive member is exposed to light by the laser scanner unit 4 as the exposure portion, so that the electrostatic latent image is formed on the surface of the photosensitive drum 2.

Thereafter, a developing bias is applied to a developing roller 12 (12Y, 12M, 12C, 12K) of the developing device 5 as the developing portion. As a result, the toner of each of the colors is deposited on the electrostatic latent image, formed on the surface of the photosensitive drum 2, by the laser scanner unit 4. As a result, the toner image is formed on the surface of the photosensitive drum 2.

Next, the toner images formed on the surfaces of the photosensitive drums 2 are primary-transferred onto the intermediary transfer belt 8 as a transfer-receiving member by applying a primary transfer bias to the primary transfer rollers as transfer portions. As a result, a full-color toner image is formed on the surface of the intermediary transfer belt 8 as the transfer-receiving member. Incidentally, the toner remaining on the surface of the photosensitive drum 2 after the primary transfer is removed by being scraped off by the cleaning blade 6.

Thereafter, the intermediary transfer belt 8 as the transfer-receiving member is circulated, so that the toner images are sent to the secondary transfer portion. Then, in the secondary transfer portion, a secondary transfer bias is applied to the secondary transfer roller 11, so that the toner images on the intermediary transfer belt 8 as the transfer-receiving member are transferred onto the sheet S.

Then, the sheet S on which the toner images are transferred is heated and pressed in a fixing device 20, whereby the toner images on the S are fixed on the sheet S. Thereafter, the sheet S on which the toner images are fixed is discharged onto a discharge portion 24 by a discharging roller pair 23 of the image forming apparatus A.

Next, an energization constitution to a cartridge 100 will be described.

Figure 2:
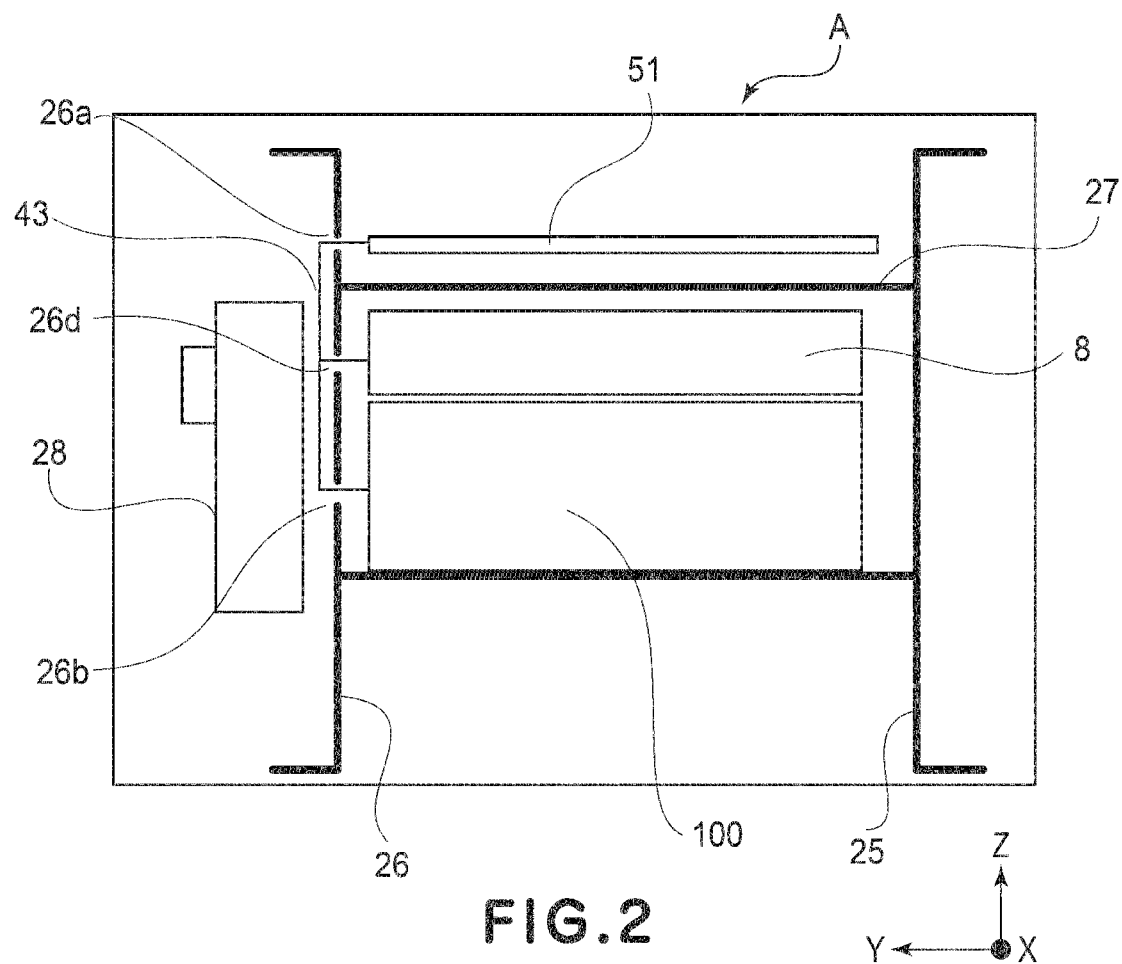
FIG. 2 is a schematic view of the image forming apparatus according to the embodiment as seen from a side surface of the image forming apparatus.

FIG. 2 is a schematic view of the image forming apparatus A as seen from a side surface of the image forming apparatus A. In FIG. 2, the image forming apparatus A is provided with a voltage source substrate 51 as an electric substrate for generating a high voltage on the basis of electric power supplied from a commercial power (voltage) source. The voltage source substrate 51 is disposed above (on +Z side) the cartridge 100, and a circuit for supplying high voltages to the charging roller 3 and the developing roller 12 which are members to be supplied with the voltages is mounted on the voltage source substrate 51. Further, on this voltage source substrate 51, a circuit other than the circuit for supplying the high voltages is also mounted.

The voltage source substrate 51 is horizontally disposed above the intermediary transfer belt 8 between a front side plate 25 and a rear side plate 26 which are a frame of the image forming apparatus A. Further, the voltage source substrate 51 and the cartridge 100 are electrically connected to each other via 8 feeders (feeder lines) 43 which are wires and are also electroconductors. Incidentally, each of feeders 43 is formed with a soft wire rod, such as a plated soft copper wire, which is not subjected to insulating coating, and therefore, even when energization paths are different from each other, these energization paths can be wet by a single kind of the feeder 43.

The 8 feeders 43 are first wired so as to pass through 8 openings 26a of the rear side plate 26 toward a rear surface side (a side of +Y direction) of the image forming apparatus A. Then, the 8 feeders 43 are wired in a direction (−Z direction) perpendicular to the voltage source substrate 51 at a position between a driving unit 28, including motors and gears for driving the members in the cartridge 100, and the rear side plate 26. Then, the 8 feeders 43 pass through the 8 openings 26b and are wired toward a front side (−Y side) of the image forming apparatus A and are connected to the cartridge 100. Thus, the feeders 43 are wired by passing through a rear surface of the rear side plate 26 so as to detour the intermediary transfer belt 8.

Further, the voltage source substrate 51 and the intermediary transfer unit 40 including the intermediary transfer belt 8 are electrically connected to each other via two feeders 43 other than the above-described 8 feeders 43 electrically connecting the voltage source substrate 51 and the cartridge 100. These two feeders 43 pass through two openings 26a of the rear side plate 26 and are wired to the rear surface side (a side of +Y direction). Then, the two feeders 43 are wired in the direction (−Z direction) perpendicular to the voltage source substrate 51 at a position between the driving unit 28 and the rear side plate 26. Then, the two feeders 43 are electrically connected to the intermediary transfer unit 40 via a contact spring 71 which is projected through the opening 26d of the rear side plate 26 and which is described later. The contact spring 71 and an energization constitution to the intermediary transfer unit 40 will be described later specifically.

Figure 3:
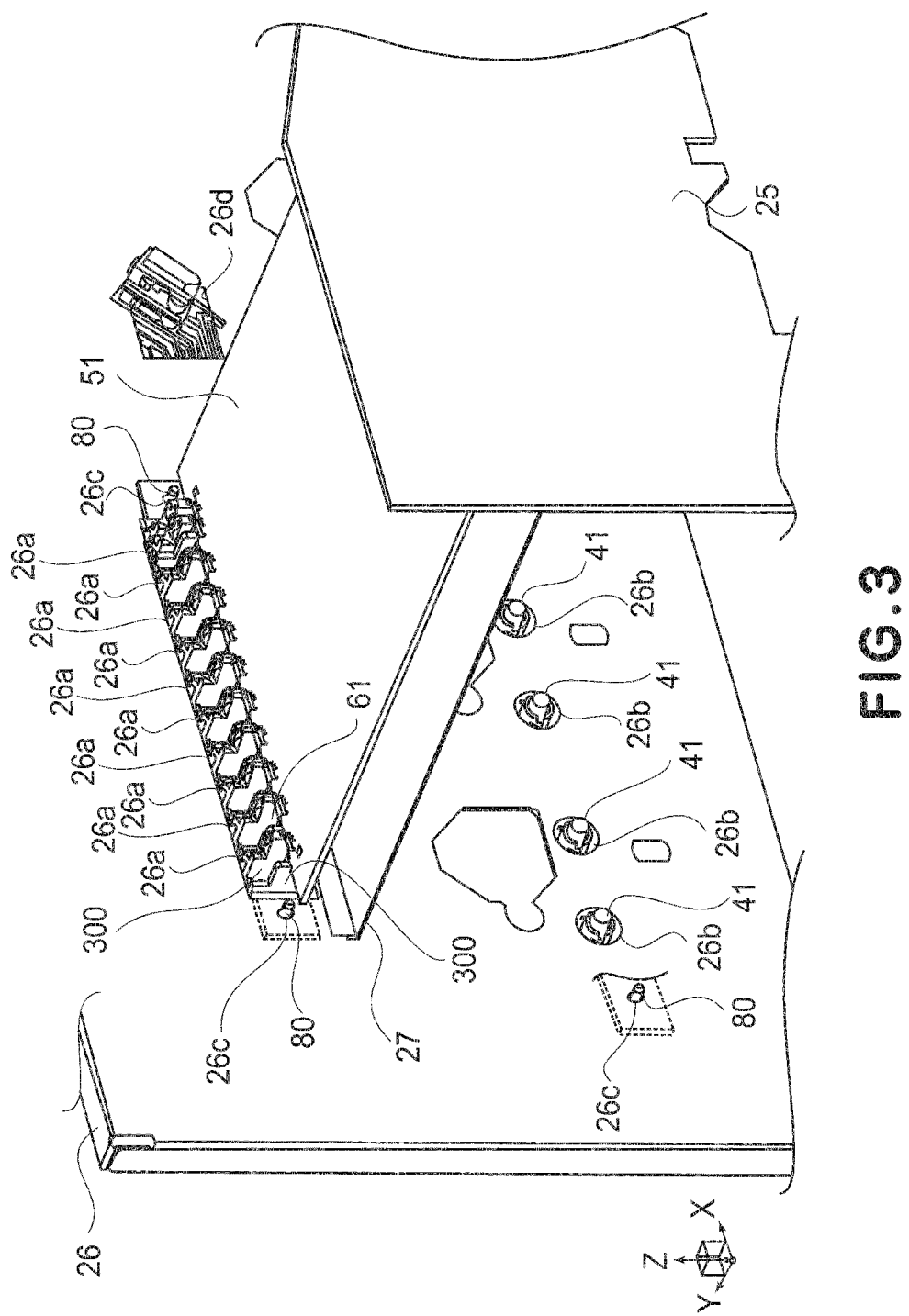
FIG. 3 is a schematic perspective view of a periphery of a voltage source substrate in the embodiment.
Figure 4:
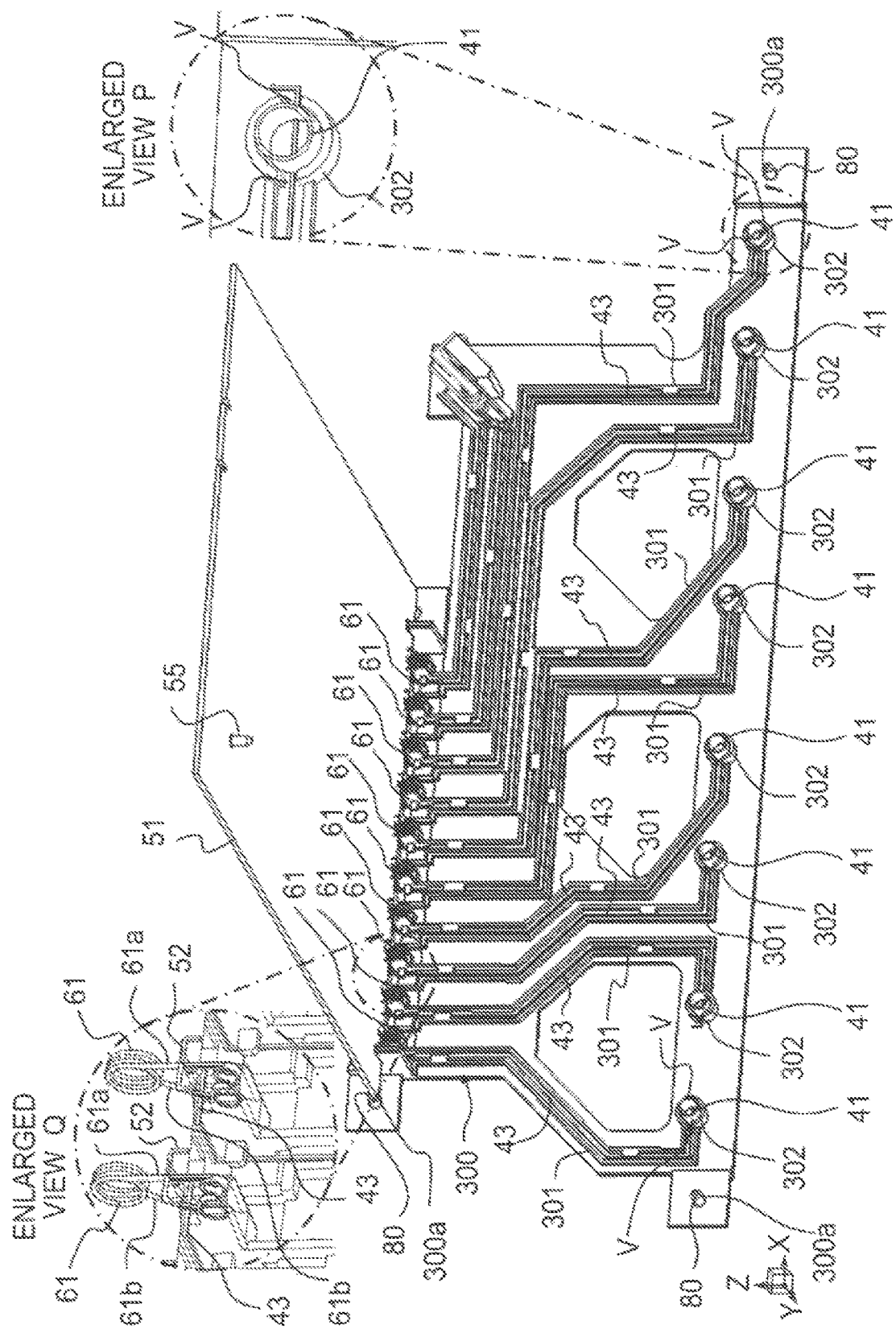
FIG. 4 is a schematic perspective view of the periphery of the voltage source substrate in the embodiment.
Figure 5:
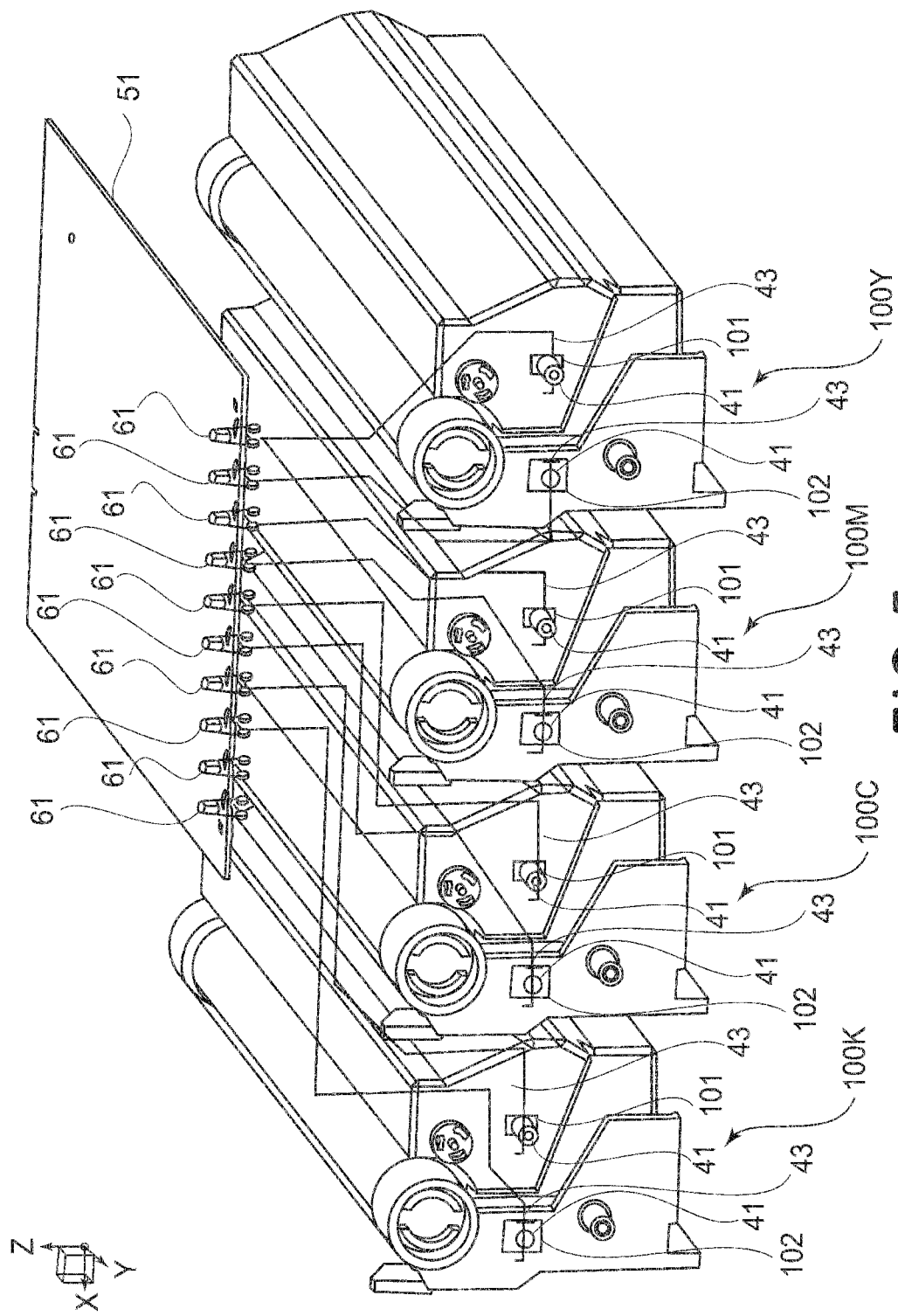
FIG. 5 is a schematic perspective view of the periphery of the voltage source substrate in the embodiment.
Figure 6:
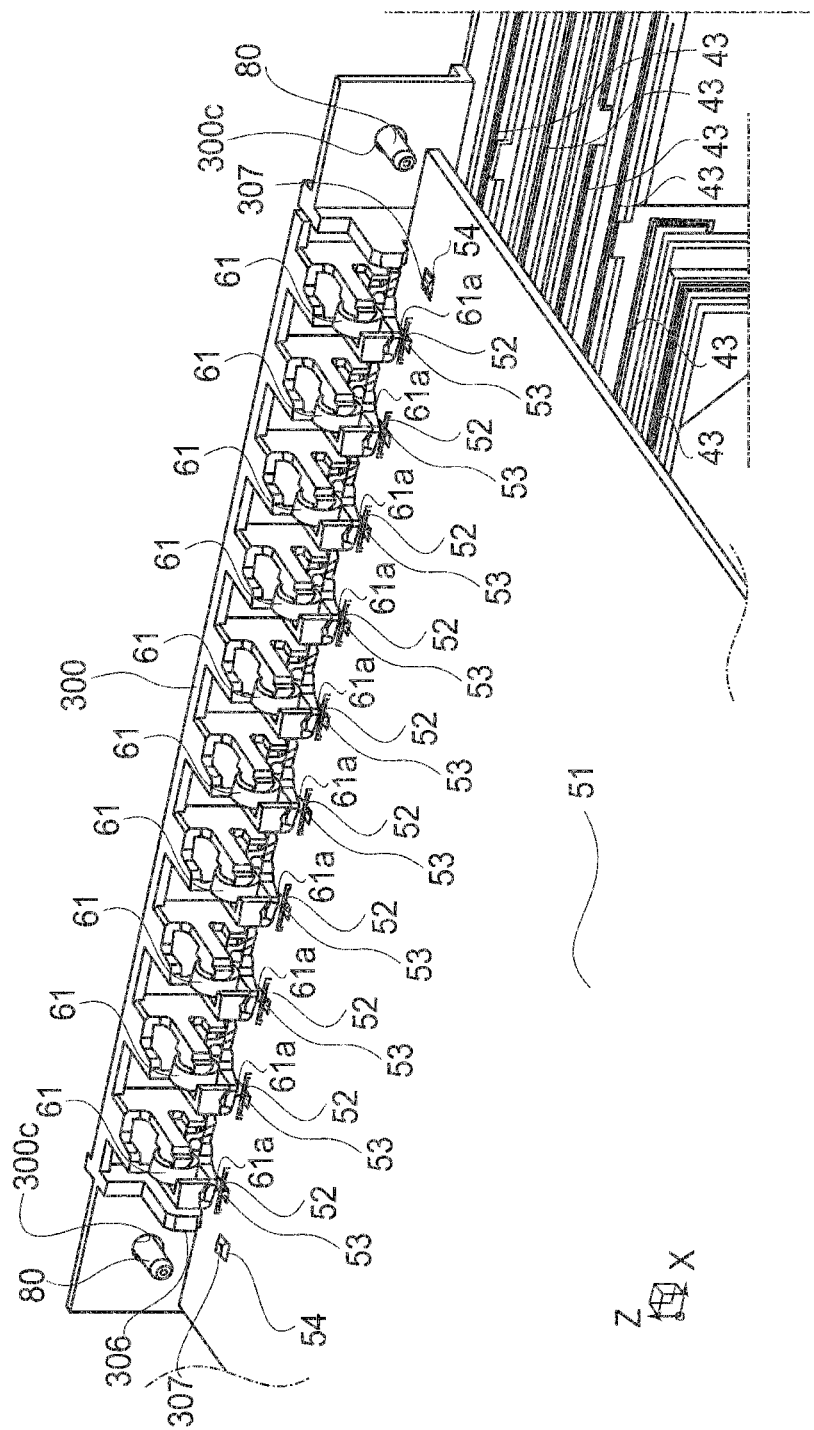
FIG. 6 is an enlarged perspective view of an electrical contact portion of the voltage source substrate in the embodiment.

FIG. 3, FIG. 4 and FIG. 5 are schematic perspective views of a periphery of the voltage source substrate 51. Here, in FIGS. 3 to 5, in order to illustrate a connection relationship between the voltage source substrate 51 and the image forming apparatus A, the intermediary transfer unit 40, the cartridge 100, the front side plate 25 and the rear side plate 26 which are the frame of the image forming apparatus A, and the like are appropriately omitted. FIG. 6 is an enlarged perspective view of an electrical contact portion of the voltage source substrate 51.

In FIGS. 3 to 6, electrical connection between the cartridge 100 and the feeders 43 is carried out via 8 springs 41 which are electroconductive compression coil springs. The springs 41 contact the feeders 43 at one end portion and contact an energization plate 101 and an energization plate 102 which are electrical contact portions of the cartridge 100. The energization plate 101 is electrically connected to the developing roller 12 of the developing device 5 as a member-to-be-energized, and the energization plate 102 is electrically connected to the charging roller 3 as the member-to-be-energized.

Incidentally, between the spring 41 and the energization plate 101 or the energization plate 102 and between the spring 41 and the feeder 43, a predetermined contact pressure is generated by an elastic force of the spring 41. Further, the spring 41 is formed of a wire rod, which is called a spring material, in general, such as a spring steel material, a piano (music) wire or a stainless steel wire. Further, in this embodiment, the spring 41 may also be springs of other kinds such as compression coil springs and torsion coil springs.

Further, the feeders 43 are held by a holder 300. The holder 300 is an insulating resin member and is provided between the rear side plate 26 and the driving unit 28, and is fixed to the rear side plate 26 with screws 80. The screws 80 are inserted into screw holes 300a of the holder 300 and screw holes 26c of the rear side plate 26. Thus, the holder 300 is formed with an insulating member, so that even in the case where the rear side plate 26 and the driving unit 28 are electroconductive members and the holder 300 contacts the rear side plate 26 and the driving unit 28, electrical connection of these members with the feeders 43 held by the holder 300 is shut off by the holder 300. Accordingly, insulation of the rear side plate 26 and the driving unit 28 from the feeders 43 can be carried out.

Incidentally, in FIG. 4, although 10 feeders 43 are illustrated, the two feeders 43 of these feeders 43 are used for electrical connection between the voltage source substrate 51 and the primary transfer rollers 7 described later.

The holder 300 includes a holding portion 301 for holding the feeder 43 while guiding the feeder 43 and includes a cylindrical holding portion 302 for holding the spring 41. The spring 41 is inserted into a cylinder of the holding portion 302 so that a helix thereof is parallel to generatrix of the holding portion 302. Further, the holding portion 302 is provided at two positions with cuts V for permitting insertion of the feeder 43 as shown in an enlarged view P of FIG. 4. In the cylindrical holding portion 302, the feeder 43 is inserted along the cut V, and thereafter, the spring 41 is inserted, so that the feeder 43 and the spring 41 contact each other.

The electrical connection between the voltage source substrate 51 and the feeders 43 is performed via a plurality of contact springs 61 which are electroconductive coil springs for forming an electroconductive path. As shown in an enlarged view Q of FIG. 4, the contact spring 61 includes one arm portion (one end portion) 61b contacting the feeder 43 and the other arm portion (the other end portion) 61a contacting the electrical contact portion 52 which is the jumper wire mounted to the voltage source substrate 51. The jumper wire which is the electrical contact portion 52 is not only soldered to the voltage source substrate 51 but also connected to an electroconductive pattern formed on the voltage source substrate 51.

Incidentally, in FIG. 4, although 10 contact springs 61 are illustrated, the two contact springs 61 of these contact springs are used for electrical connection between the voltage source substrate 51 and the primary transfer rollers 7 described later.

Incidentally, between the contact spring 61 and the electrical contact portion 52 and between the contact spring 61 and the feeder 43, a predetermined contact pressure is generated by an elastic force of the contact spring 61. That is, a constitution in which the one arm portion 61b is press-contacted to the feeder 43 and the other arm portion 61a is press-contacted to the voltage source substrate 51 is employed. Further, the contact spring 61 is formed of a wire rod, which is called a spring material in general, such as a spring steel material, a piano wire or a stainless steel wire.

The plurality of contact springs 61 are mounted on the holders 300 which are supporting members at a plurality of positions. Here, in FIG. 7, a perspective view of a spring supporting structure in which a single contact spring 61 of the contact springs 61 is mounted is shown. Part (a) of FIG. 7 is the perspective view of a spring supporting portion before the contact spring 61 is mounted, and part (b) of FIG. 7 is the perspective view showing a state in which the contact spring 61 is mounted in the spring supporting portion.

In FIG. 7, in the spring supporting portion of the holder 300, the feeder 43 is hooked on a groove portion 312. The spring supporting portion is constituted by a first supporting portion 310 which is a first opposing portion positioned opposed to one end of a coil portion 61c with respect to an axial direction (a direction indicated by a broken line H) and a second supporting portion 311 which is a second opposing portion positioned opposed to the other end of the coil portion 61c with respect to the axial direction.

The first supporting portion 310 and the second supporting portion 311 have supporting surfaces 310a and 311a, each for positioning the coil portion 61c of the contact spring 61, respectively, and include shaft portions 310c and 311c, respectively, as supporting portions for supporting the contact spring 61 in a mounting position. Further, the first supporting portion 310 is elastically deformable in the axial direction of the coil portion 61c by a shape extending to the shaft portion 310c in an L-shape (reverse L-shape) as seen from above.

Further, below the respective shaft portions 310c and 311c, inclined surfaces 310b and 311b formed so that a gap (spacing) therebetween is broadened from the shaft portions 310c and 311c toward below more than a width of the coil portion 61c of the mounted contact spring 61 with respect to the axial direction is.

Further, when the contact spring 61 is mounted in the holder 300, a state in which the arm portion 61b which is one spring force acting portion is press-contacted to the feeder 43 and in which the arm portion 61a which is the other spring force acting portion is hooked on an arm supporting portion (force receiving portion) 311d formed in a recessed portion is formed. This state is a stand-by state of the contact spring 61 before the above-described voltage source substrate 51 is mounted.

Next, a method of mounting the contact spring 61 in the holder 300 will be described.

Parts (a1)-(a3) to (c1)-(c3) of FIG. 8 are schematic views for illustrating a series of operations when the contact spring 61 is mounted in the holder 300. Here, parts (a1) to (a3) of FIG. 8 show a state before the contact spring 61 is mounted, parts (b1) to (b3) of FIG. 8 show an intermediary process of the mounting of the contact spring 61, and parts (c1) to (c3) of FIG. 8 show a state after the contact spring 61 is mounted. Further, parts (d1) to (d3) of FIG. 8 are schematic views showing a state in which the voltage source substrate 51 is mounted to the holder 300. Further, in parts (a1)-(a3) to (d1)-(d3) of FIG. 8, a suffix numeral 1 shows a top view of the single spring supporting portion, a suffix numeral 2 shows a side view taken along an A-A line of the associated figure (a1, b1, c1, d1), and a suffix numeral 3 shows a side view taken along a B-B line of the associated figure (a1, b1, c1, d1). Incidentally, solid black portions in the figures represent cross sections.

In FIG. 8, description will be made along the order of mounting the contact spring 61. As shown in part (a1) to (a3) of FIG. 8, when the contact spring 61 is mounted, the contact spring 61 is moved in an arrow G direction, in the figures, perpendicular to the axial direction while keeping the arm portions 61a and 61b of the contact spring 61 in natural states. Further, when the contact spring 61 is moved as it is, an outer diameter portion of the coil portion 61c of the contact spring 61 with respect to the axial direction contacts the inclined surfaces 310b and 311b of the first supporting portion 310 and the second supporting portion 311, respectively (part (a3) of FIG. 8).

When opposite end portions of the coil portion 61c are further pushed in while being contacted to the associated inclined surfaces 310b and 311b, as shown in parts (b1) to (b3) of FIG. 8, the inclined surface 310b is pressed in interrelation with movement of the contact spring 61 as it is. As a result, the inclined surface 310b functions as an interrelating portion for elastically deforming a part of the first supporting portion 310 and rotates the first supporting portion 310 in an arrow R1 direction in part (b1) of FIG. 8. That is, by a force for moving the contact spring 61, the first supporting portion 310 is elastically deformed so that the first supporting portion 310c moves in a direction of being away from the contact spring 61, so that the shaft portion 310c is retracted in the axial direction of the coil portion 61c. Further, at this time, the arm portion 61a of the contact spring 61 is contacted to the arm supporting portion 311d of the second supporting portion 311 so as to be hooked on the arm supporting portion 311d, and the arm portion 61b of the contact spring 61 is contacted (press-contacted) to the feeder 43 and is electrically connected to the feeder 43.

Then, the contact spring 61 is further pushed in as shown in parts (c1) to (c3) of FIG. 8 and when the coil portion 61c of the contact spring 61 passes through the shaft portion 310c of the first supporting portion 310, the first supporting portion 310 which has been elastically deformed by the coil portion 61c of the contact spring 61 is returned to an original position. As a result, the shaft portion 310c of the first supporting portion 310 and the shaft portion 311c of the second supporting portion 311 enter the inner diameter portion of the coil portion 61c of the contact spring 61 and shaft-support the coil portion 61c. At this time, the arm portions 61c and 61b of the contact spring 61 have angular setting in a mounted state.

Thus, the spring can be easily mounted in the holder 300 only by performing an operation of moving the contact spring 61 of the torsion coil spring in one direction, so that operation efficiency of an assembling operation can be improved. Further, also in an assembling operation by a robot which has developed in recent years, although robots performing various complicated operations have appeared, a mounting operation of a complicated spring such as the torsion coil spring is very difficult, so that an actuality, a manual assembling operation has been carried out. However, when the spring supporting structure as in this embodiment is employed, not only the manual assembling operation is made more efficient but also the assembling operation by the robot can be realized, and in addition, the spring can be mounted in a short time. Therefore, efficiency enhancement of manufacturing and efficiency enhancement of the operation in service maintenance are realized.

Further, the arm portions 61a and 61b of the contact spring 61 mounted in the states of parts (c1) to (c3) of FIG. 8 receive reaction forces F2 and F1, respectively. Further, the contact spring 61 held at the inner diameter portion of the coil portion by the shaft portions 310c and 311c of the opposite side surface supporting member receives combined reaction force F12 obtained by combining these reaction forces F1 and F2. On the other hand, a direction of the combined reaction force F12 and a direction in which the first supporting portion 310 is elastically deformed cross each other substantially perpendicularly, and therefore, the spring reaction force does not have the influence on the deformation of the first supporting portion 310. As a result, it is possible to prevent deformation of the supporting portion of the holder 300 due to the reaction forces of the contact spring 61 during the mounting of the contact spring 61 and thereby to prevent disconnection (disengagement) of the contact spring 61.

Further, the inclined surfaces 310b and 311b of the shaft portions (coil supporting portions) 310c and 311c are provided on a side opposite from the direction of the combined reaction force F12, i.e., on a side surface portion side with respect to an assembling direction (arrow G direction in the figures). As a result, the contact spring 61 is not disconnected from the shaft portions 310c and 311c by the combined reaction force F12.

In addition, also in the state in which the voltage source substrate 51 is mounted as shown in parts (d1) to (d3) of FIG. 8, similarly as in parts (c1) to (c3), the arm portions 61c and 61b of the contact spring 61 receive reaction forces F1' and F2', respectively, from the holder 300 in which the contact spring 61 is mounted. Further, the contact spring 61 in which the inner diameter portion of the coil portion is held by the shaft portions 310c and 311c of the opposite side surface supporting member receives, from the holder 300, a combined reaction force F12' obtained by combining the reaction forces F1' and F2'. On the other hand, a direction of the combined reaction force F12' and the direction in which the first supporting portion 310 elastically deformed cross each other substantially perpendicularly, and therefore, the combined reaction force F12' has no influence on the deformation of the first supporting portion 310.

Next, a constitution of energization from the voltage source substrate 51 to the primary transfer rollers 7 as members-to-be-energized will be described.

FIG. 9 is a perspective view of the voltage source substrate 51 and the intermediary transfer unit 40. FIG. 10 is a perspective view of the intermediary transfer unit 40 from which a part of members thereof such as the intermediary transfer belt 8 is omitted.

In FIGS. 9 and 10, the primary transfer rollers 7 are not only rotatably supported at opposite end portions thereof by bearing 206 (206Y, 206M, 206C, 206K) but also urged by springs 205 (205Y, 205M, 205C, 205K). The springs 205 and the bearings 206 are formed of electroconductive materials.

Further, the intermediary transfer unit 40 is provided with two energization plates 203 (203a, 203b) which are electrical contact portions and which are metal plates of stainless steel or the like and with two feeders 204 (204a, 204b) which are wire rods, such as a solder-plated annealed copper wire or a steel wire, which are not subjected to insulation coating. The feeders 204 contact the energization plates 203 at one end portion and contact the four springs 205 at the other end portion. That is, the primary transfer rollers 7 are electrically connected to the energization plates 203 via the springs 205, the bearings 206 and the wire rods 204.

Further, the energization plate 203 contacts a contact spring 71 which is a torsion coil spring. The contact spring 71 contacts an end portion of the feeder 43 contacting the contact spring 61. That is, the primary transfer roller 7 is electrically connected to the voltage source substrate 51 via the spring 205, the bearing 206, the feeder 204, the energization plate 203, the contact spring 71, the feeder 43 and the contact spring 61. Incidentally, a shape and a material of the contact spring 71 are similar to those of the contact spring 61.

Next, a method of mounting the contact spring 71 in the holder 300 will be described.

Parts (a) and (b) of FIG. 11 are schematic views for illustrating a procedure when the contact spring 71 and a contact spring supporting member 200 for holding the contact spring 71 are mounted in the holder 300. Further, parts (a) and (b) of FIG. 12 are schematic views of the contact spring supporting member 200 as seen in directions of arrows D and E, respectively, shown in part (a) of FIG. 11.

As shown in FIG. 12, the contact spring supporting member 200 has a structure in which spring supporting portions 210 and 212 as two elastically deformable first opposing portions and a fixed supporting portion 211 as a second opposing portion are integrally assembled into a unit at a periphery of a screw hole 213.

The spring supporting portions 210 and 212 and the fixed supporting portion 211 are provided with first supporting portions 210a and 212a for constraining opposite end surfaces of the coil portion 71c of the contact spring 71 with respect to an axial direction (a direction in which an inner diameter portion is formed) and with a second supporting portion 211a constituting the fixed supporting portion, respectively. Further, the spring supporting portions 210 and 212 and the fixed supporting portion 211 are provided with shaft portions 210c, 212c and 211c, respectively, as supporting portions each for shaft-supporting the contact spring 71 in a mounting position by being inserted into an inner diameter portion of the coil portion 71c of the contact spring 71.

The shaft portions 210c, 211c and 212c are provided with inclined surfaces 210b, 211b and 212b, respectively, contacting the coil portion 71c when the coil portion 71c of the contact spring 71 is mounted in the mounting position from an arrow K1 direction. The inclined surfaces 210b, 211b and 212b are formed so that a gap (spacing) between adjacent inclined surfaces gradually increases toward a direction opposite to the arrow K1 direction more than a width of the coil portion 71c with respect to the axial direction is. Further, the inclined surfaces 210b and 212b function as an interrelating portion for elastically deforming the spring supporting portions 210 and 212 by being pushed away in interrelation with an operation of moving the contact spring 71 to the mounting position along the inclined surfaces 210b and 212b, so that the shaft portions 210c and 212c are capable of being deformed as shown by broken lines in part (a) of FIG. 12.

As an assembling procedure, first, as shown in part (a) of FIG. 11, the contact spring supporting member 200 is attached to a primary transfer energization portion 300a of the holder 300 from the arrow K1 direction.

Then, as shown in part (b) of FIG. 11, the contact spring supporting member 200 and the holder 300 are fastened with a screw 80 inserted into screw holes 213 and 300c from an arrow K2 direction, and two contact springs 71 are moved in arrow K1 directions and thus are mounted. At that time, the coil portions 71c contact the above-described inclined surfaces 210b, 211b and 212b and elastically deform the spring supporting portions 210 and 212 and thus retract the shaft portions 210c and 212c in the axial direction of the coil portions 71c so that the contact springs 71 are movable.

Thereafter, in the mounting position, the shaft portions 210c, 211c and 212c enter the coil portions 71c of the contact springs 71 and support the coil portions 71c, so that mounting is completed.

Next, a mounting constitution of the intermediary transfer unit 40 will be described.

Parts (a) and (b) of FIG. 13 are perspective views of the contact springs 71 in a state of being mounted in the holder 300. Here, part (a) of FIG. 13 shows a state in which the intermediary transfer unit 40 is not mounted, and part (b) of FIG. 13 shows a state in which the intermediary transfer unit 40 is mounted.

In FIG. 13, before the intermediary transfer unit 40 is mounted, the arm portions 71*a* of the contact springs 71 are in a state in which the arm portions 71*a* abut against a contact spring abutment surface 300*b* of the holder 300. When the intermediary transfer unit 40 is mounted, the energization plate 203 of the intermediary transfer unit 40 is slid (moved) in an arrow K3 direction (horizontal direction) while bringing the energization plate 203 of the intermediary transfer unit 40 into contact with the contact springs 71. As a result, the contact springs 71 is bent, so that the contact springs 71 are press-contacted to the energization plate 203. As a result, the primary transfer rollers 7 and the contact springs 71 are electrically connected to each other.

Thus, the plurality of contact springs 71 which are the torsion coil springs are assembled by being integrally held by the contact spring supporting member 200 and by attaching the contact spring supporting member 200 to the holder 300. As a result, the plurality of contact springs 71 can be easily assembled, so that assembling operativity can be improved.

Next, a method of mounting (attaching) the voltage source substrate 51 to the holder 300 will be described.

Parts (a) and (b) of FIG. 14 are schematic views for illustrating a mounting operation of the voltage source substrate 51. Here, part (a) of FIG. 14 shows a state in which the contact springs 61 are mounted before the voltage source substrate 51 is mounted to the holder 300, and part (b) of FIG. 14 shows a state after the voltage source substrate 51 is mounted to the holder 300.

In FIG. 14, when the voltage source substrate 51 is mounted to the holder 300, first, the voltage source substrate 51 is inclined obliquely downward, and then the arm portions 61*a* of the contact springs 61 are guided to cut-away portions 53 formed on the voltage source substrate 51 while moving the voltage source substrate 51 in an arrow K4 direction. As a result, the electrical contact portions 52 of the voltage source substrate 51 and the arm portions 61*a* of the contact springs 61 contact each other.

Next, a free end of the voltage source substrate 51 is pushed in a recessed portion 306 of the holder 300 so as to be sandwiched in the recessed portion 306. As a result, positioning of the free end of the voltage source substrate 51 is performed.

Next, two positioning holes 54 formed in the voltage source substrate 51 shown in FIG. 6 are engaged with two boss portions 307 of the holder 300, respectively. Thereafter, also as grounding, the voltage source substrate 51 is fastened to a stay 27 with a screw 55, so that mounting of the voltage source substrate 51 is completed.

Incidentally, in the above-described embodiment, in a constitution shown in FIG. 7, the first supporting portion 310 (a right-side portion obtained by cutting between the shaft portions 310*c* and 311*c* along a plane perpendicular to the shaft portions in FIG. 7) corresponds to the first supporting portion in the present invention. Further, the second supporting portion 311 (a left-side portion obtained by cutting between the shaft portions 310*c* and 311*c* along the plane perpendicular to the shaft portions in FIG. 7) corresponds to the second supporting portion in the present invention. Further, the shaft portion 310*c* corresponds to the spring supporting portion in the present invention. That is, these portions correspond to constituent elements necessary to the torsion coil spring supporting structure of the present invention, and entirety of the holder 300 is not a constitution necessary to the torsion coil spring supporting structure of the present invention. Incidentally, the feeder 43 may also be a constitution corresponding to the constituent element of the torsion coil spring supporting structure of the present invention.

Further, in addition to the above-described constitution shown in FIG. 7, a constitution including the contact 61 corresponding to the torsion coil spring in the present invention corresponds to the electrical connecting member of the present invention.

Further, in a constitution shown in FIG. 12, the spring supporting portions 210 and 212 correspond to the first supporting portion in the present invention, the spring supporting portion 211 corresponds to the second supporting portion in the present invention, and the shaft portions 210*c* and 212*c* correspond to the spring supporting portion in the present invention. That is, those portions correspond to constituent elements necessary to the torsion coil spring supporting structure of the present invention.

Further, in addition to the above-described constitution shown in FIG. 12, a constitution including the contact spring 71 corresponding to the torsion coil spring in the present invention corresponds to the electrical connecting member of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-197463 filed on Oct. 19, 2018, which is hereby incorporated by reference herein in its entirety.

What is claimed is:

1. A torsion coil spring supporting structure comprising:
   a first supporting portion provided at a position opposing one end of a torsion coil spring with respect to an axial direction of the torsion coil spring and configured to support the torsion coil spring; and
   a second supporting portion provided at a position opposing the other end of the torsion coil spring with respect to the axial direction and configured to support the torsion coil spring,
   wherein said first supporting portion includes a spring supporting portion cooperative with said second supporting portion to support the torsion coil spring at a mounting position, and
   wherein said first supporting portion is elastically deformable, by moving the torsion coil spring, to permit the torsion coil to move to the mounting position in a direction crossing the axial direction and elastically restorable to place said spring supporting portion in an inner diameter portion of the torsion coil spring, thus supporting the torsion coil spring at the mounting position.

2. A torsion coil spring supporting structure according to claim 1, wherein said first supporting portion is elastically deformed by moving the torsion coil spring from a direction crossing the axial direction toward the mounting position between said first supporting portion and said second supporting portion, and the torsion coil spring is supported at the mounting position by inserting said spring supporting portion into the inner diameter portion of the torsion coil spring.

3. A torsion coil spring supporting structure according to claim 1, wherein first supporting portion includes an inclined surface for moving said spring supporting portion, and wherein said inclined surface is moved away from the torsion coil spring in the axial direction by moving the torsion coil spring to the mounting position.

4. A torsion coil spring supporting structure according to claim 1, wherein the combination of said first supporting portion and said spring supporting portion has an L-shape with said spring supporting portion extending from one end of said first supporting portion.

5. A torsion coil spring supporting structure according to claim 1, wherein either one of said first supporting portion and said second supporting portion includes a force receiving portion contacting one end portion of a wire rod constituting the torsion coil spring, and
    wherein the torsion coil spring is configured so that an elastic force in a direction perpendicular to the axial direction acts on the other end portion of the wire rod constituting the torsion coil spring.

6. A torsion coil spring supporting structure according to claim 5, wherein said force receiving portion is a recessed portion.

7. An electrical connecting member comprising:
    a torsion coil spring which functions as a contact as a part of an electroconductive path and which has an electroconductivity;
    a first supporting portion provided at a position opposing one end of said torsion coil spring with respect to an axial direction of said torsion coil spring and supporting said torsion coil spring; and
    a second supporting portion provided at a position opposing the other end of said torsion coil spring with respect to the axial direction and supporting said torsion coil spring,
    wherein said first supporting portion includes a spring supporting portion supporting said torsion coil spring by being inserted into an inner diameter portion of said torsion coil spring, and
    wherein said first supporting portion is elastically deformable so that said spring supporting portion is moved away from said torsion coil spring in the axial direction.

8. An electrical connecting member according to claim 7, wherein said first supporting portion is elastically deformed by moving said torsion coil spring from a direction crossing the axial direction toward a mounting position between said first supporting portion and said second supporting portion, and said torsion coil spring is supported at the mounting position by inserting said spring supporting portion into the inner diameter portion of said torsion coil spring.

9. An electrical connecting member according to claim 7, wherein first supporting portion includes an inclined surface for moving said spring supporting portion, and wherein said inclined surface is moved away from the torsion coil spring in the axial direction by moving said torsion coil spring to a mounting position.

10. An electrical connecting member according to claim 7, wherein the combination of said first supporting portion and said spring supporting portion has an L-shape with said spring supporting portion extending from one end of said first supporting portion.

11. An electrical connecting member according to claim 7, wherein either one of said first supporting portion and said second supporting portion includes a force receiving portion contacting one end portion of a wire rod constituting said torsion coil spring, and
    wherein said torsion coil spring is configured so that an elastic force in a direction perpendicular to the axial direction acts on the other end portion of the wire rod constituting said torsion coil spring.

12. An electrical connecting member according to claim 11, wherein said force receiving portion is a recessed portion.

13. An electrical connecting member according to claim 11, wherein said one end portion of the wire rod constituting said torsion coil spring contacts a feeder connected to an electric substrate at a mounting position.

14. An electrical connecting member according to claim 13, wherein said the other end portion of the wire rod constituting said torsion coil spring is electrically connected to a voltage source substrate including a high voltage source circuit for generating a high voltage at the mounting position.

15. An image forming apparatus comprising:
    an image forming portion configured to form an image; and
    an electrical connecting member according to claim 14.

* * * * *